United States Patent
Wen et al.

(10) Patent No.: US 9,620,292 B2
(45) Date of Patent: Apr. 11, 2017

(54) DIRECT-CURRENT CAPACITOR MODULE AND LAMINATED BUSBAR STRUCTURE THEREOF

(71) Applicant: Delta Electronics (Shanghai) Co., Ltd., Shanghai (CN)

(72) Inventors: Sen-Lin Wen, Shanghai (CN);
Jian-Ping Ying, Shanghai (CN);
Hong-Jian Gan, Shanghai (CN); She Zhao, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 88 days.

(21) Appl. No.: 14/719,331

(22) Filed: May 22, 2015

(65) Prior Publication Data
US 2015/0340157 A1    Nov. 26, 2015

(30) Foreign Application Priority Data

May 23, 2014 (CN) .......................... 2014 1 0222351

(51) Int. Cl.
*H01G 4/38* (2006.01)
*H02M 7/00* (2006.01)

(52) U.S. Cl.
CPC ............. *H01G 4/38* (2013.01); *H02M 7/003* (2013.01)

(58) Field of Classification Search
None
See application file for complete search history.

(56) References Cited

U.S. PATENT DOCUMENTS

| 8,451,133 B2 | 5/2013 | Lavene et al. | |
| 2008/0068801 A1* | 3/2008 | Wilk | H01G 2/04 361/702 |
| 2011/0090614 A1* | 4/2011 | Guerin | H01G 2/04 361/274.3 |

(Continued)

FOREIGN PATENT DOCUMENTS

| CN | 101420171 A | 4/2009 |
| CN | 102549688 A | 7/2012 |

(Continued)

*Primary Examiner* — Dion R Ferguson
(74) *Attorney, Agent, or Firm* — CKC & Partners Co., Ltd.

(57) ABSTRACT

A direct-current capacitor module is disclosed in this disclosure. The direct-current capacitor module includes a plurality of direct-current capacitors and a laminated busbar structure. The direct-current capacitors are grouped into a first portion and a second portion. The laminated busbar structure is electrically connected to capacitor binding posts of the direct-current capacitors. The laminated busbar structure has a positive terminal and a negative terminal. The laminated busbar structure includes a first busbar layer, a second busbar layer and an insulation layer. The first busbar layer includes a first sub-busbar layer, which is electrically connected between at least two direct-current capacitors of the first portion. The second busbar layer includes a second sub-busbar layer, which is electrically connected between at least two direct-current capacitors of the second portion. The insulation layer is disposed between the first busbar layer and the second busbar layer.

22 Claims, 7 Drawing Sheets

(56) References Cited

U.S. PATENT DOCUMENTS

2012/0082887 A1* 4/2012 Ninomiya ................ H01G 9/08
                                                                    429/159
2014/0377592 A1* 12/2014 Pyzza .................... H01G 11/10
                                                                    429/7

FOREIGN PATENT DOCUMENTS

| CN | 102882385 A | 1/2013 |
| CN | 103354414 A | 10/2013 |
| CN | 103607159 A | 2/2014 |
| TW | 201349953 A | 12/2013 |
| WO | 2013/029341 A1 | 3/2013 |

* cited by examiner

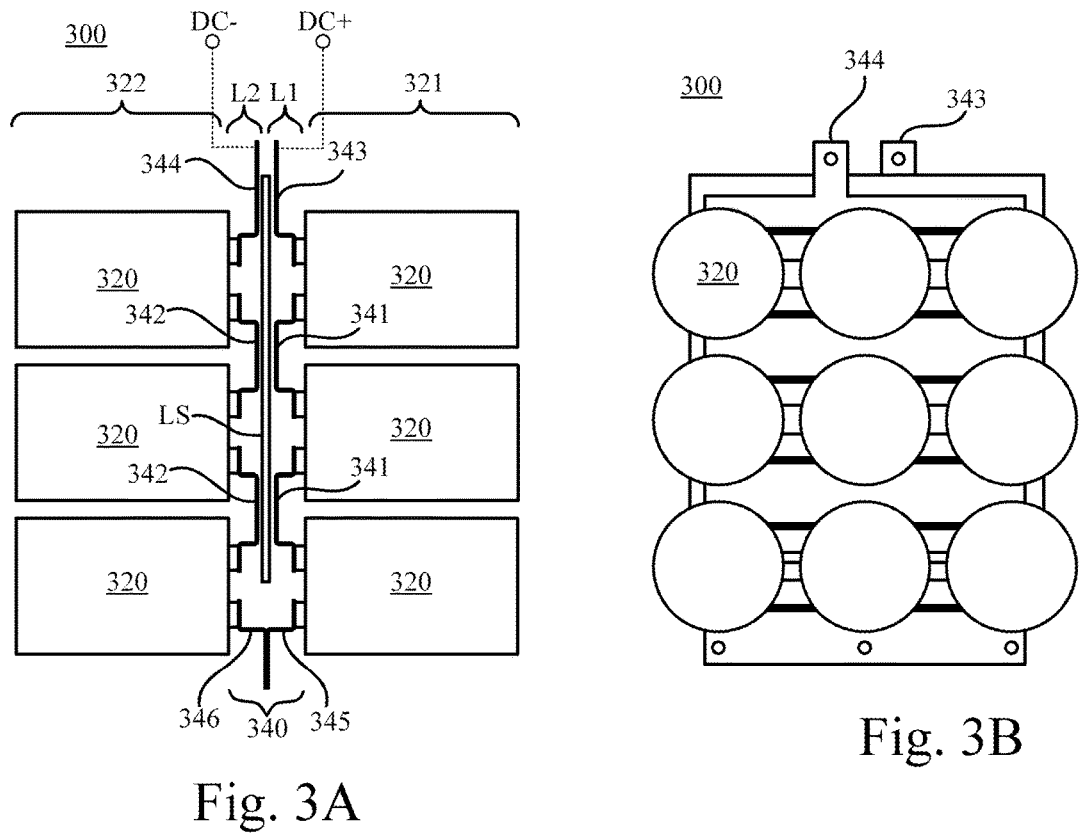
Fig. 3A
Fig. 3B
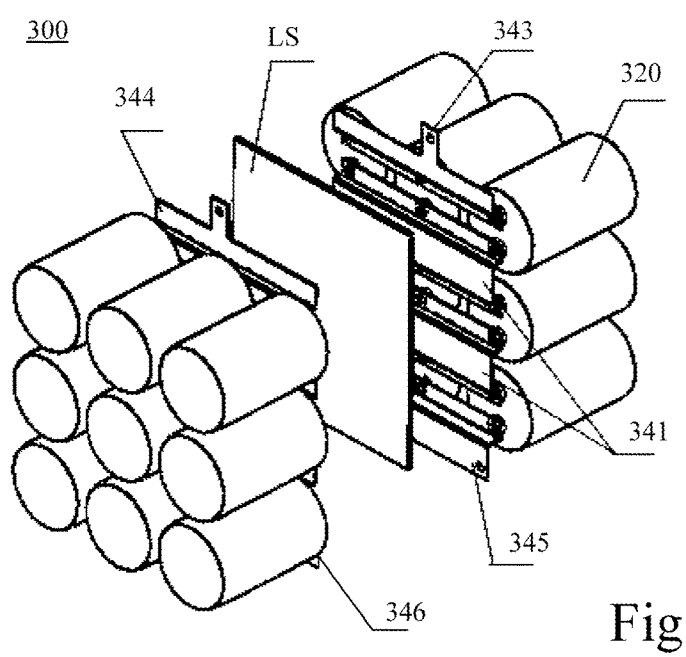
Fig. 3C

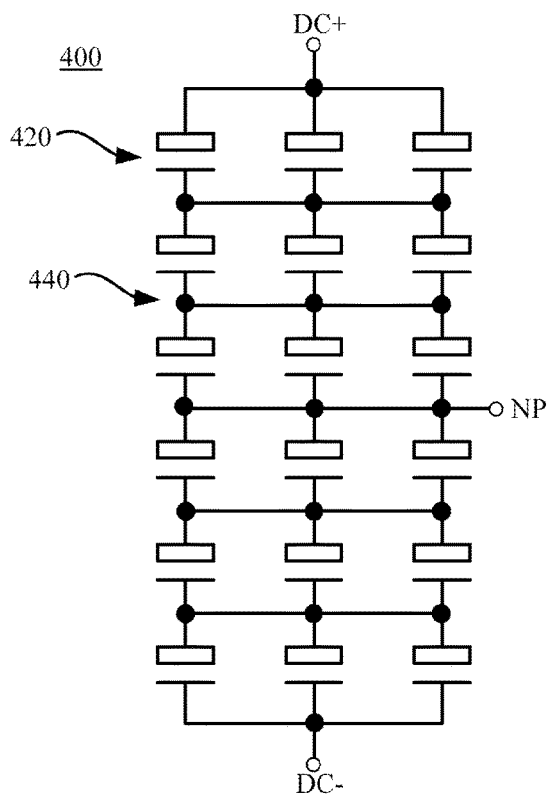
Fig. 4A
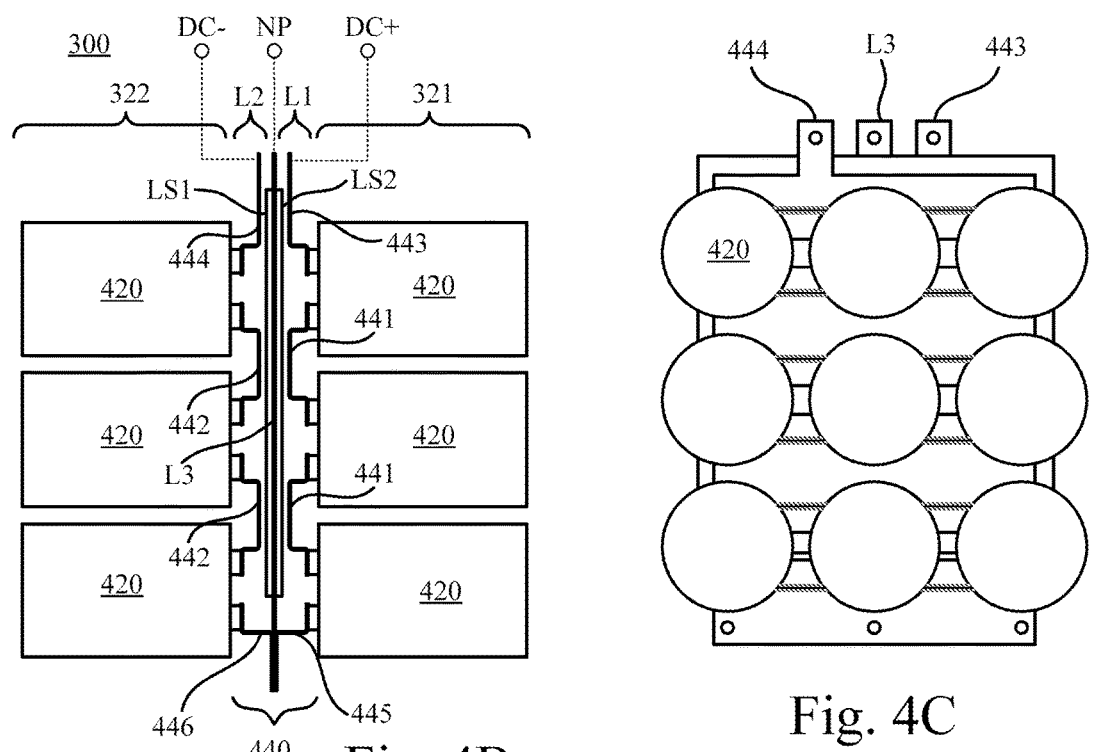
Fig. 4B
Fig. 4C

DIRECT-CURRENT CAPACITOR MODULE AND LAMINATED BUSBAR STRUCTURE THEREOF

RELATED APPLICATIONS

This application claims priority to China Application Serial Number 201410222351.7, filed May 23, 2014, which is herein incorporated by reference.

BACKGROUND

Field of Invention

The present invention relates to power electronics area. More particularly, the present invention relates to a direct-current capacitor module of a power converter and a laminated busbar structure thereof.

Description of Related Art

Electronic products usually require a specific voltage, a specific current or a specific power to be operated properly. Therefore, power converters are needed to transform various power inputs (e.g., power from a household electricity outlet) into signals with appropriate power specifications.

A direct-current (DC) capacitor module (also known as DC-link) is an important part of the power converter. A parasitic inductance of a connective conductor of the direct-current capacitor module is closely related to an over-voltage standard that a power device (e.g., a power switch) of the power converter must withstand. If the parasitic inductance of the connective conductor is reduced, the over-voltage standard withstood by the power device can be reduced, such that a reliability of the power converter is elevated.

The DC capacitor module of a medium-voltage high-power power converter usually consists of a plurality of DC capacitors (with specific electronic specifications) connected in parallel/serial to each others. The DC capacitor module includes several DC capacitors, internal connective conductors (between the DC capacitors), external connective conductors of the DC capacitor module, an insulating layer between aforesaid connective conductors and mounting members for supporting the DC capacitors.

A common way to implement the connective conductors in the DC capacitor module includes placing all DC capacitors on the same plane (all binding posts of the DC capacitors are arranged on the same plane) and utilizing individual connective conductors to connect the binding posts of the DC capacitors separately. The in-flow/out-flow current paths, established by the external connective conductors of the DC capacitor module, occupy a huge loop area. This traditional way is easy to implement the DC capacitors and the connective conductor layout, but the main disadvantage is that the parasitic inductance of the connective conductors will be large. The large parasitic inductance leads the over-voltage on the power device and reduces the reliability of the power converter.

How to reduce the parasitic inductance of the connective conductors, reduce the manufacturing cost, and provide high stability/reliability of the DC capacitor module are important topics in the industry.

SUMMARY

The disclosure provides a direct-current (DC) capacitor module and a laminated busbar structure thereof, so as to solve aforesaid problems. The disclosure may reduce the parasitic inductance of the busbar structure. In addition, the busbar structure and the insulation layer structure in the disclosure are simply, easy-to-manufacture, easy-to-assemble, compact-sized and have lower costs.

An aspect of the disclosure provides a direct-current capacitor module, which includes a plurality of direct-current capacitors and a laminated busbar structure. Each of the direct-current capacitors includes two capacitor binding posts. The direct-current capacitors are grouped into a first portion and a second portion. The capacitor binding posts of the direct-current capacitors in the first portion are disposed to face the capacitor binding posts of the direct-current capacitors in the second portion respectively. The laminated busbar structure is configured to be electrically connected with the capacitor binding posts of the direct-current capacitors. The laminated busbar structure has a positive wiring terminal and a negative wiring terminal. The laminated busbar structure includes a first busbar layer, a second busbar layer and an insulation layer. The first busbar layer includes a first sub-busbar electrically connected between at least two direct-current capacitors in the first portion. The second busbar layer includes a second sub-busbar electrically connected between at least two direct-current capacitors in the second portion. The insulation layer is disposed between the first busbar layer and the second busbar layer.

Another aspect of the disclosure provides a laminated busbar structure as in aforesaid embodiments.

According to aforesaid embodiments, the first busbar layer and the second busbar layer are disposed in mirror symmetry relative to the insulation layer. Therefore, the operating currents flowing in/out through the external wiring terminal (i.e., the positive wiring terminal and the negative wiring terminal) and the sub-burs between the DC capacitors have substantially the same current amplitude and opposite current directions, so as to eliminate the magnetic field outside the busbar and also to reduce the parasitic inductance of the laminated busbar structure. In addition, electrical connective screws and apertures for aforesaid screws, required by the traditional laminated busbar structure, are not necessary to the insulation layer in the disclosure. Furthermore, there are certain air gaps formed between the first busbar layer and the insulation layer and between the second busbar layer and the insulation layer. In other words, the first busbar layer and the second busbar layer are separated by the insulation layer (e.g., the insulation plate or other solid insulation materials) and the air gaps, so as to form a double insulation effect which can easily ensure the reliability of the electrical insulation.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 3A is a sectional schematic diagram illustrating a direct-current capacitor module according to another embodiment of the disclosure;

FIG. 3B is a top-view diagram illustrating the direct-current capacitor module in FIG. 3A from another visual angle;

FIG. 3C is an exploded diagram illustrating the direct-current capacitor module in FIG. 3A from another visual angle;

FIG. 4A is an equivalent circuit diagram illustrating a direct-current capacitor module according to an embodiment of the disclosure;

FIG. 4B is a sectional schematic diagram illustrating the direct-current capacitor module in FIG. 4A;

FIG. 4C is a top-view diagram illustrating the direct-current capacitor module in FIG. 4B from another visual angle;

DETAILED DESCRIPTION

Figure 1A:
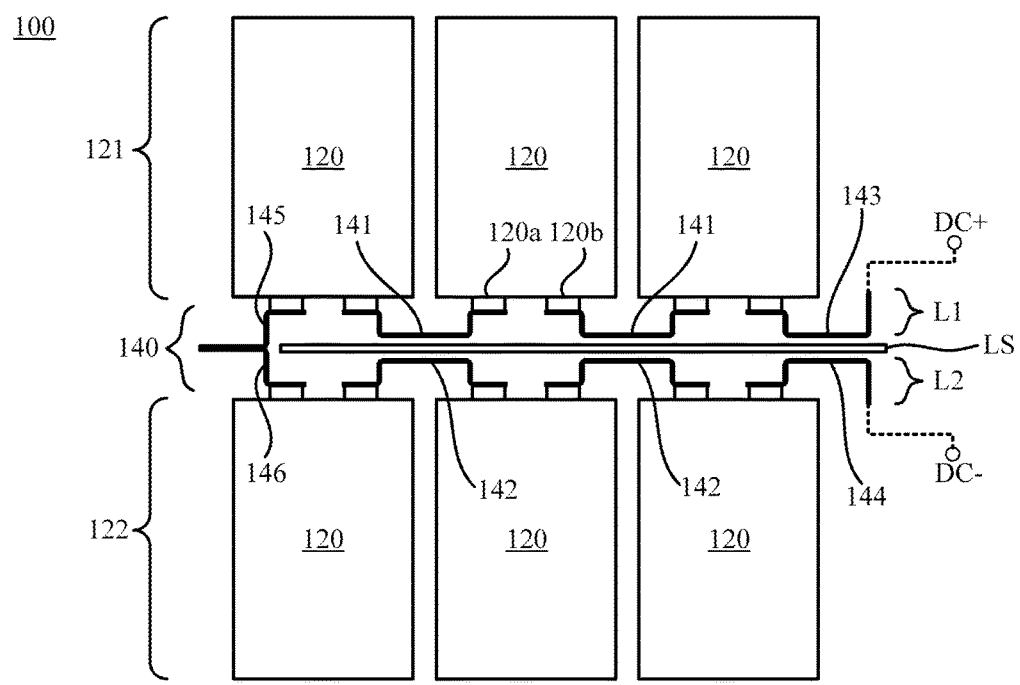
FIG. 1A is a sectional schematic diagram illustrating a direct-current capacitor module according to an embodiment of the disclosure.

Reference will now be made in detail to the present embodiments of the invention, examples of which are illustrated in the accompanying drawings. Wherever possible, the same reference numbers are used in the drawings and the description to refer to the same or like parts.

Figure 1B:
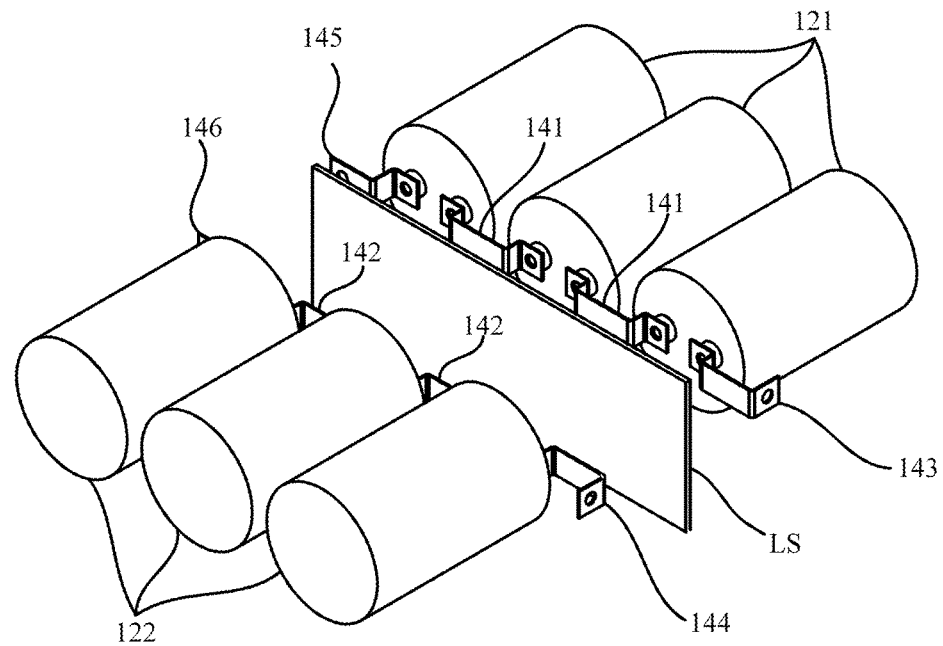
FIG. 1B is an exploded diagram illustrating the direct-current capacitor module in FIG. 1A from another visual angle.

Reference is made to FIG. 1A and FIG. 1B. FIG. 1A is a sectional schematic diagram illustrating a direct-current (DC) capacitor module 100 according to an embodiment of the disclosure. FIG. 1B is an exploded diagram illustrating the direct-current capacitor module 100 in FIG. 1A from another visual angle.

As shown in FIG. 1A, the direct-current capacitor module 100 includes a plurality of direct-current capacitors 120 and a laminated busbar structure 140. For demonstration, the direct-current capacitor module 100 as shown in figures includes six direct-current capacitors 120. However, the disclosure is not limited thereto.

Each of the direct-current capacitors 120 includes two capacitor binding posts 120a and 120b. The direct-current capacitors 120 are grouped into a first portion 121 and a second portion 122. The capacitor binding posts 120a of the direct-current capacitors 120 in the first portion 121 are disposed to face the capacitor binding posts 120b of the direct-current capacitors 120 in the second portion 122 respectively. As shown in FIG. 1A and FIG. 1B, all capacitor binding posts of the direct-current capacitors 120 belonging to the first portion 121 and the second portion 122 are disposed to face inward. The laminated busbar structure 140 is disposed between the first portions 121 and the second portion 122 of the direct-current capacitors 120. In order to boost the assembly speed, reduce manufacturing cost and reduce the size of the direct-current capacitor module 100, the direct-current capacitors 120 divided into two parts (i.e., the first portion 121 and the second portion 122) are able to be connected to the laminated busbar structure 140 effectively.

In some embodiments, the capacitor binding posts 120a and 120b of the direct-current capacitors 120 in the first portion 121 are located on the same line; and similarly, the capacitor binding posts 120a and 120b of the direct-current capacitors 120 in the second portion 122 are also located on the same line, so as further to boost assembly efficiency, reduce manufacturing cost and reduce the size of the direct-current capacitor module 100.

As shown in FIG. 1A, the laminated busbar structure 140 is configured to electrically connect with all of the capacitor binding posts 120a and 120b of the direct-current capacitors 120. The laminated busbar structure 140 has a positive wiring terminal DC+ and a negative wiring terminal DC− for connecting outward to other external circuits (e.g., a reticular module, an inverter module or other equivalent circuits).

The laminated busbar structure 140 includes a first busbar layer L1, a second busbar layer L2 and an insulation layer LS. The first busbar layer L1 includes first sub-busbars 141. Each of the first sub-busbars 141 is electrically connected between two direct-current capacitors 120 in the first portion 121, so as to realize the serial connection between the direct-current capacitors 120. As shown in the embodiment in FIG. 1A, the direct-current capacitor module 100 is a two-level direct-current capacitor module. The first busbar layer L1 further includes a positive wiring busbar 143 and a third sub-busbar 145. The positive wiring busbar 143 is electrically connected to the positive wiring terminal DC+ and one of the direct-current capacitors 120 in the first portion 121.

The positive wiring busbar 143, the first sub-busbar 141 and the third sub-busbar 145 form the first busbar layer L1. In practical applications, the first sub-busbar 141, the positive wiring busbar 143 and the third sub-busbar 145 are respectively electrically connected to the direct-current capacitors 120 in the first portion 121 with screws.

On the other hand, the second busbar layer L2 further includes second sub-busbars 142. Each of the second sub-busbars 142 is electrically connected between two direct-current capacitors 120 in the second portion 122, so as to realize the serial connection between the direct-current capacitors 120. In the embodiment, the second busbar layer L2 further includes a negative wiring busbar 144 and a fourth sub-busbar 146. The negative wiring busbar 144 is electrically connected to the negative wiring terminal DC− and one of the direct-current capacitors 120 in the second portion 122.

The negative wiring busbar 144, the second sub-busbar 142 and the fourth sub-busbar 146 form the second busbar layer L2. In practical applications, the negative wiring busbar 144, the second sub-busbar 142 and the fourth sub-busbar 146 are respectively electrically connected to the direct-current capacitors 120 in the second portion 122 with screws.

The third sub-busbar 145 of the first busbar layer L1 is electrically connected to the fourth sub-busbar 146 of the second busbar layer L2, such that the direct-current capacitors 120 respectively connected to the first busbar layer L1 are aligned in series with the direct-current capacitors 120 respectively connected to the second busbar layer L2.

The insulation layer LS is disposed between the first busbar layer L1 and the second busbar layer L2. The insulation layer LS is an insulation plate with a complete planar surface. There are air gaps existed between the first busbar layer L1 and the insulation layer LS and between the second busbar layer L2 and the insulation layer LS.

The first busbar layer L1 (including the first sub-busbar 141, the positive wiring busbar 143 and the third sub-busbar 145) and the second busbar layer L2 (including the second sub-busbar 142, the negative wiring busbar 144 and the fourth sub-busbar 146) are disposed substantially in mirror symmetry at opposite sides of the insulation layer.

In the embodiment, the current flowing through the first busbar layer L1 and the current flowing through the second busbar layer L2 have the same current amplitude and opposite current directions. In an embodiment, when the direct-current capacitor module 100 interchanges a current with the external circuit (not shown in figures) through the positive wiring terminal DC+ and the negative wiring terminal DC−, the current flows inward from the negative wiring busbar 144 of the second busbar layer L2, via the second sub-busbar 142 and the fourth sub-busbar 146 of the second busbar layer L2, and then via the third sub-busbar 145 and the first sub-busbar 141 of the first busbar layer 141, and at last flows outward through the positive wiring busbar 143.

Relative to the insulation layer LS at the center, aforesaid current pattern is basically in mirror symmetry. Busbars of the laminated busbar structure 140 are parallel and overlapped. The in-flow and out-flow currents have the same current amplitude and opposite directions, so as to eliminate the magnetic field outside the laminated busbar structure 140 and also to reduce the parasitic inductance of the laminated busbar structure 140.

Figure 2A:
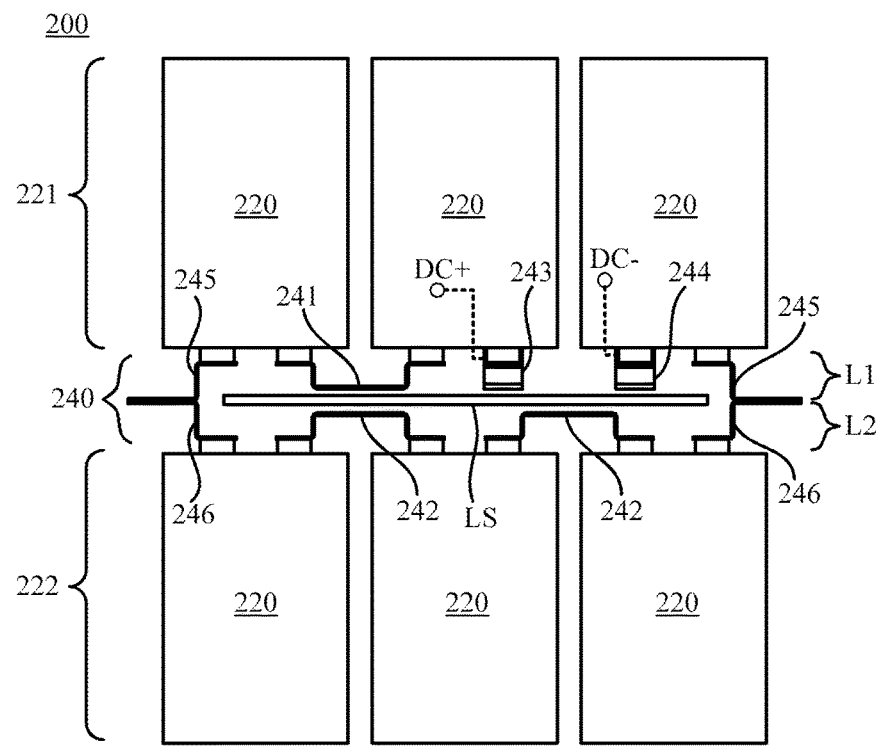
FIG. 2A is a sectional schematic diagram illustrating a direct-current capacitor module according to another embodiment of the disclosure.
Figure 2B:
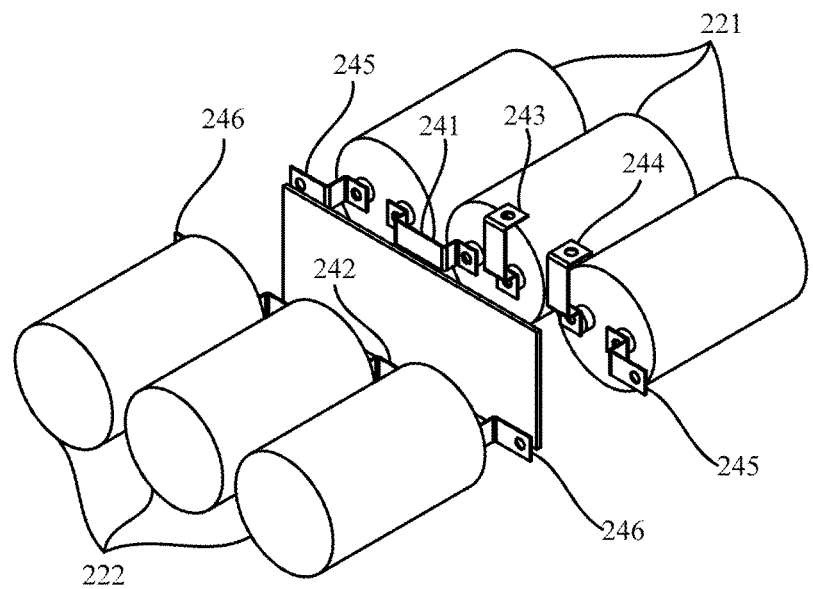
FIG. 2B is an exploded diagram illustrating the direct-current capacitor module in FIG. 2A from another visual angle.

Reference is also made to FIG. 2A and FIG. 2B. FIG. 2A is a sectional schematic diagram illustrating a direct-current (DC) capacitor module 200 according to another embodiment of the disclosure. FIG. 2B is an exploded diagram illustrating the direct-current capacitor module 200 in FIG. 2A from another visual angle.

As shown in FIG. 2A, the direct-current capacitor module 200 includes a plurality of direct-current capacitors 220 and a laminated busbar structure 240. For demonstration, the direct-current capacitor module 200 as shown in figures includes six direct-current capacitors 220. However, the disclosure is not limited thereto. The embodiment shown in FIG. 2A is substantially a variation from the embodiment shown in FIG. 1A. For brevity, the following explanations mainly focuses on differences between two embodiments, and other details of structures and behaviors of the embodiment shown in FIG. 2A can be referred to corresponding descriptions of the embodiment of FIG. 1A and FIG. 1B.

As shown in FIG. 2A and FIG. 2B, the first busbar layer L1 include the positive wiring busbar 243 and the negative wiring busbar 244. The positive wiring busbar 243 is electrically connected to the positive wiring terminal DC+ and at least one of the direct-current capacitors 220 in the first portion 221. The negative wiring busbar 244 is electrically connected to the negative wiring terminal DC− and at least one of the direct-current capacitors 220 (other than the direct-current capacitor 220 connected with the positive wiring busbar 243) in the first portion 221.

The first busbar layer L1 further includes a first sub-busbar 241 and a third sub-busbar 245. The first sub-busbar 241 is configured to connect between any two of the direct-current capacitors 220 in the first portion 221. The second busbar layer L2 further includes a second sub-busbar 242 and a fourth sub-busbar 246. The second sub-busbar 242 is configured to connect between any two of the direct-current capacitors 220 in the second portion 222. The third sub-busbar 245 is electrically connected with the fourth sub-busbar 246 for forming the serial connection between the first busbar layer L1 and the second busbar layer L2. The insulation layer LS is disposed between the first busbar layer L1 and the second busbar layer L2.

In the embodiment shown in FIG. 1A and FIG. 1B, the positive wiring busbar 143 and the negative wiring busbar 144 are connected to one direct-current capacitors in the first portion 121 and another direct-current capacitors in the second portion 122 and disposed on one side surface of the direct-current capacitor module 100. On the contrary, the embodiment shown in FIG. 2A and FIG. 2B, the positive wiring busbar 243 and the negative wiring busbar 244 are both disposed on the same side (adjacent to the first portion 221) of the direct-current capacitor module 200, and located at the middle of the first portion 221 of the direct-current capacitor module 200.

Reference to made FIG. 3A, FIG. 3B and FIG. 3C. FIG. 3A is a sectional schematic diagram illustrating a direct-current (DC) capacitor module 300 according to another embodiment of the disclosure. FIG. 3B is a top-view diagram illustrating the direct-current capacitor module 300 in FIG. 3A from another visual angle. FIG. 3C is an exploded diagram illustrating the direct-current capacitor module 300 in FIG. 3A from another visual angle.

As shown in FIG. 3A, the direct-current capacitor module 300 includes a plurality of direct-current capacitors 320 and a laminated busbar structure 340. In practical applications, the direct-current capacitor module 300 includes 2*N*M direct-current capacitors 320. M and N are both positive integers. For convenience of explanation, the direct-current capacitor module 300 as shown in figures includes eighteen direct-current capacitors 320 (as the example of M=3 and N=3), but the disclosure is not limited thereto.

The embodiment as shown in FIG. 3A, FIG. 3B and FIG. 3C is substantially a variation from the embodiment shown in FIG. 1A and FIG. 1B. Each of the first portion 321 and the second portion 322 of the direct-current capacitors 320 comprises N*M direct-current capacitors (each portion includes 3*3 direct-current capacitors in this case) arranged in three rows, and each row has three direct-current capacitors 320. The positive wiring busbar 343 is electrically connected to three direct-current capacitors 320 on one row in the first portion 321. The negative wiring busbar 344 is electrically connected to three direct-current capacitors 320 on one row in the second portion 320. Each of the first sub-busbar 341 is electrically connected between 2*3 direct-current capacitors 320 on two adjacent rows in the first portion 321. On the other hand, each of the second sub-busbar 342 is electrically connected between 2*3 direct-current capacitors 320 on two adjacent rows in the second portion 322.

Therefore, these eighteen direct-current capacitors 320 of the direct-current capacitor module 300 are shunt-connected and then serial-connected. Compared to the embodiment shown in FIG. 1A, the sub-busbars in the embodiment shown in FIG. 3A are lengthen correspondingly and include apertures for accommodating the electrically-connective screw bolts. The size of the insulation layer LS in the middle is correspondingly enlarged. Other characteristics of the laminated busbar structure 340 are substantially similar to the laminated busbar structure 140 in the embodiment shown in FIG. 1A.

Figure 4D:
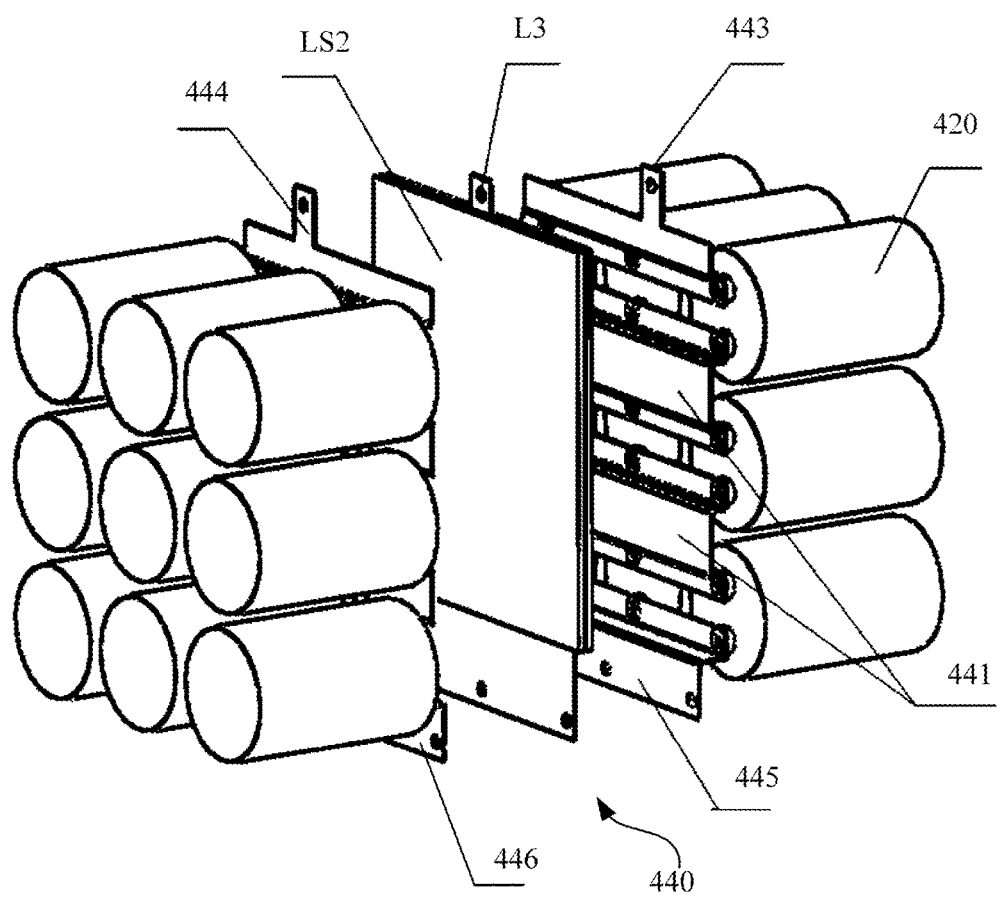
FIG. 4D is an exploded diagram illustrating the direct-current capacitor module in FIG. 4B from another visual angle.

Reference is made to FIG. 4A, FIG. 4B, FIG. 4C and FIG. 4D. FIG. 4A is an equivalent circuit diagram illustrating a direct-current capacitor module 400 according to an embodiment of the disclosure. FIG. 4B is a sectional schematic diagram illustrating the direct-current capacitor module 400 in FIG. 4A. FIG. 4C is a top-view diagram illustrating the direct-current capacitor module 400 in FIG. 4B from another visual angle. FIG. 4D is an exploded diagram illustrating the direct-current capacitor module 400 in FIG. 4B from another visual angle.

As shown in FIG. 4A and FIG. 4B, the direct-current capacitor module 400 includes a plurality of direct-current capacitors 420 and a laminated busbar structure 440. In practical applications, the direct-current capacitor module 400 includes 2*N*M direct-current capacitors 420. M and N are both positive integers. For convenience of explanation, the direct-current capacitor module 400 as shown in figures includes eighteen direct-current capacitors 420 (as the example of M=3 and N=3), but the disclosure is not limited thereto.

As shown in FIG. 4A, every three direct-current capacitors 420 are parallel disposed on the same row. There are six rows of the direct-current capacitors 420 serially-connected through the laminated busbar structure 440. In the embodiment, the laminated busbar structure 440 includes a positive wiring terminal DC+ and a negative wiring terminal DC−, and further includes a neutral wiring terminal NP. Three rows of the direct-current capacitors 420 are serially-connected between the positive wiring terminal DC+ and the neutral wiring terminal NP. Other three rows of the direct-current capacitors 420 are serially-connected between the neutral wiring terminal NP and the negative wiring terminal DC−.

In the embodiment, the direct-current capacitor module 400 is a multi-level direct-current capacitor module, e.g., a three-level direct-current capacitor module or a five-level direct-current capacitor module. Three-level direct-current capacitor module is illustrated in FIG. 4A to FIG. 4D. The laminated busbar structure 440 includes the first busbar layer L1, the second busbar layer L2 and the insulation layer (including LS1 and LS2). In addition, the laminated busbar structure 440 further includes a third busbar layer L3. The third busbar layer L3 is disposed within the insulation layer.

In this embodiment, the insulation layer includes a first insulation plate LS1 and a second insulation plate LS2. The first insulation plate LS1 is disposed between the third busbar layer L3 and the first busbar layer L1. The second insulation plate LS2 is disposed between the third busbar layer L3 and the second busbar layer L2. However, the insulation layer is not limited to two individual insulation plates.

In another embodiment, another variation to insulate between two adjacent busbar layers is not utilizing the insulation plate, but covering insulation material (e.g., the insulation film or the hot pressing process) onto specific area of the third busbar layer L3, which needs to be electrically-insulated. The insulation layer is formed by covering the insulation material on both sides of the third busbar layer L3.

In the embodiment, the first busbar layer L1 is formed by the positive wiring busbar 443 for connecting to the positive wiring terminal DC+, the first sub-busbar 441 for internally connecting between the direct-current capacitors 420 and the third sub-busbar 445 for connecting to the neutral wiring terminal NP. On the other hand, the second busbar layer L2 is formed by the negative wiring busbar 444 for connecting to the negative wiring terminal DC−, the second sub-busbar 442 for internally connecting between the direct-current capacitors 420 and the fourth sub-busbar 446 for connecting to the neutral wiring terminal NP. The third busbar layer is connected to the neutral wiring terminal NP.

The positive wiring busbar 443 is electrically connected to M direct-current capacitors 420 (M=3 in the embodiment) on one row in the first portion 421. The negative wiring busbar 444 is electrically connected to M direct-current capacitors (M=3 in the embodiment) on one row in the second portion 422. Each of the first sub-busbars 441 is electrically connected between 2*M direct-current capacitors 420 (2*M=6 in this embodiment) on two adjacent rows in the first portion 421. Each of the second sub-busbars 442 is electrically connected between 2*M direct-current capacitors 420 (2*M=6 in this embodiment) on two adjacent rows in the second portion 422.

The third busbar layer L3, the third sub-busbar 445 in the first busbar layer L1 and the fourth sub-busbar 446 in the second busbar layer L2 are connected to the equipotential point. There is a first insulation plate LS1 disposed between the first busbar layer L1 and the third busbar layer L3. Equivalently, there is a second insulation plate LS2 disposed between the second busbar layer L2 and the third busbar layer L3. There are air gaps formed between the first busbar layer L1 and the insulation layer LS1 and between the second busbar layer L2 and the insulation layer LS2.

The main difference from aforesaid embodiment is that there are three different external wiring terminals (e.g., the positive wiring terminal DC+, the neutral wiring terminal NP and the negative wiring terminal DC−). In an embodiment, when the direct-current capacitor module 400 interchanges current with the external circuit (not shown in figures), the current flows into the three-level direct-current capacitor module 400 from the neutral wiring terminal NP, through the third sub-busbar 445 and the first sub-busbar 441 of the first busbar layer L1, and then flows outward through the positive wiring busbar 443. The in-flow and out-flow current has the same current amplitude and opposite current directions and is in mirror symmetry. Similarly, another current pattern is that the current flows into the three-level direct-current capacitor module 400 from the negative wiring terminal DC−, through the negative wiring busbar 444 and the second sub-busbar 442 of the second busbar layer L2, and then flows outward through the fourth sub-busbar from the neutral wiring terminal NP. The in-flow and out-flow current has the same current amplitude and opposite current directions and is in mirror symmetry. Therefore, the magnetic field outside the laminated busbar structure 440 can be substantially eliminated, and the parasitic inductance of the laminated busbar structure can be reduced.

Figure 5A:
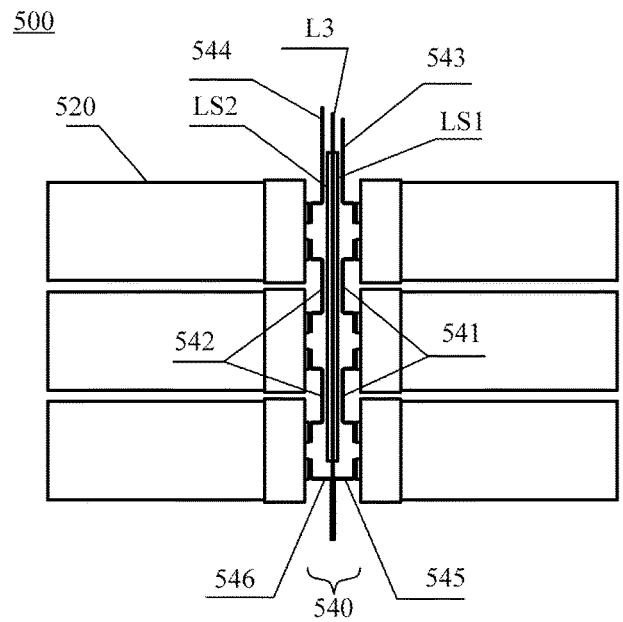
FIG. 5A is a sectional schematic diagram illustrating the direct-current capacitor module according to an embodiment of the disclosure.
Figure 5B:
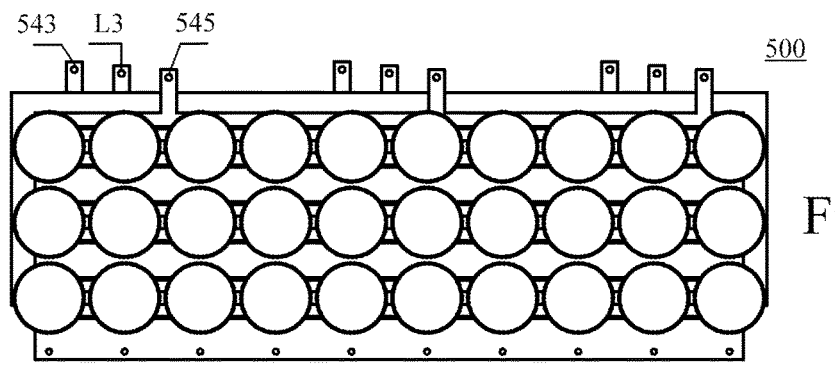
FIG. 5B is a top-view diagram illustrating the direct-current capacitor module in FIG. 5A from another visual angle.
Figure 5C:
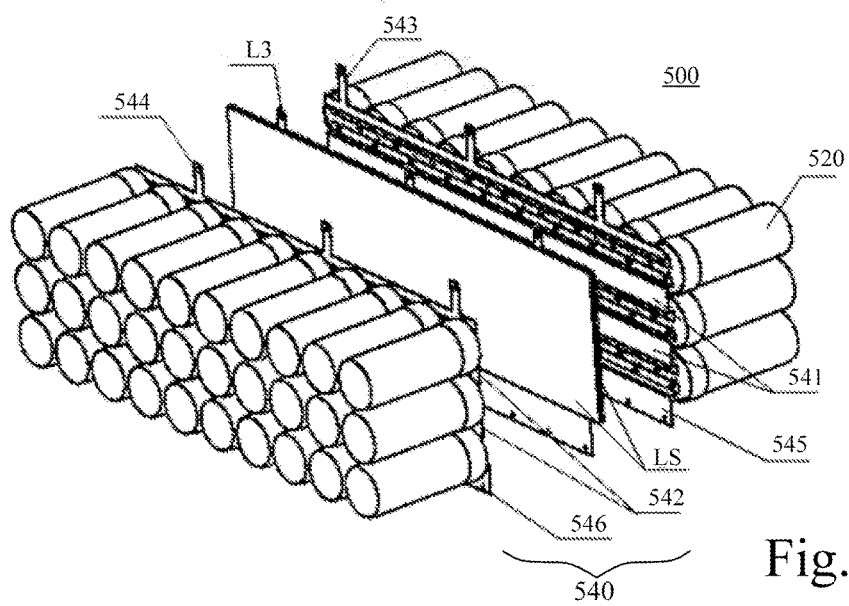
FIG. 5C is an exploded diagram illustrating the direct-current capacitor module in FIG. 5B from another visual angle.
Figure 5D:
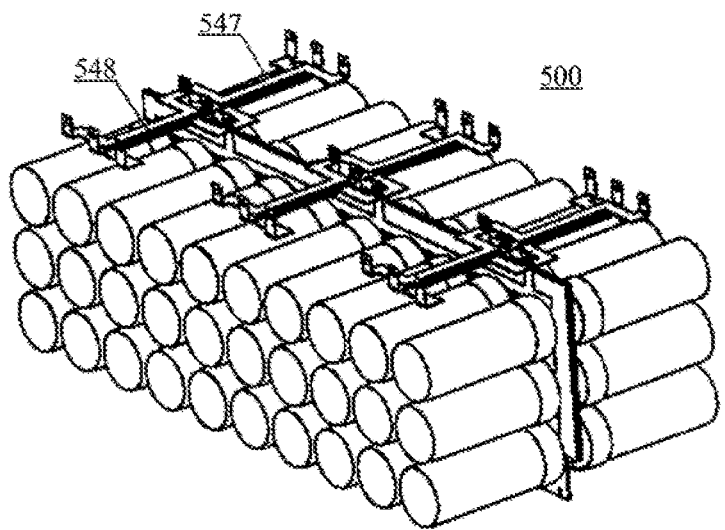
FIG. 5D, FIG. 5E and FIG. 5F are schematic diagrams illustrating the direct-current capacitor module in FIG. 5B further connecting to bridging sub-busbars.
Figure 5E:
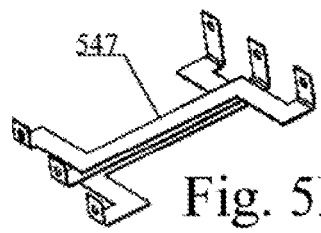
Figure 5F:
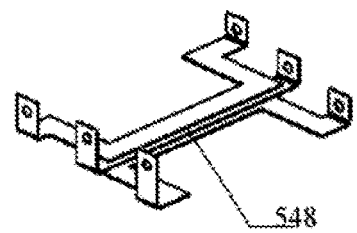

Reference is made to FIG. 5A, FIG. 5B, FIG. 5C, FIG. 5D, FIG. 5E and FIG. 5F. FIG. 5A is a sectional schematic diagram illustrating the direct-current capacitor module 500 according to an embodiment of the disclosure. FIG. 5B is a top-view diagram illustrating the direct-current capacitor module 500 in FIG. 5A from another visual angle. FIG. 5C is an exploded diagram illustrating the direct-current capacitor module 500 in FIG. 5B from another visual angle. FIG. 5D, FIG. 5E and FIG. 5F are schematic diagrams illustrating the direct-current capacitor module 500 in FIG. 5B further connecting to bridging sub-busbars 547 and 548.

In the embodiment shown in FIG. 5A, FIG. 5B and FIG. 5C, the direct-current capacitor module 500 is consisted of sixty direct-current capacitors 520. In other words, each of the first portion 521 and the second portion 522 includes thirty direct-current capacitors 520. The embodiment shown in FIG. 5A and FIG. 5B is substantially a variation from the direct-current capacitor module 400 shown in FIG. 4A to FIG. 4D. In the direct-current capacitor module 500, the positive wiring busbar 543, the third busbar layer L3 (the busbar layer indicating the neutral point) and the negative wiring busbar 544 are for connecting to external circuits and each of them include three wiring terminals. The first sub-busbars 541 and the second sub-busbars 542 between the direct-current capacitors 520 in the embodiment shown are lengthen correspondingly and include apertures for accommodating the electrically-connective screw bolts. The sizes of the first insulation plate and the second insulation plate are correspondingly enlarged. Other characteristics of the laminated busbar structure 540 are similar to the laminated busbar structure 440 referring to FIG. 4A to FIG. 4D.

As shown in FIG. 5B, FIG. 5D, FIG. 5E and FIG. 5F, the positive wiring busbar 543, the third busbar layer L3 and the negative wiring busbar 544, which are utilized for outward connecting, are connected with the bridging sub-busbars 547 and 548. There are three sets of the direct-current external wiring terminals (the positive wiring terminal DC+, the neutral wiring terminal NP and the negative wiring terminal DC−). The direct-current capacitor module 500 and the laminated busbar structure 540 can be applied on all kinds of converter products sharing the direct-current capacitor module and have advantages of size-reducing and capacitor-saving.

For example, in practical applications of a variable-frequency driver (VFD), three terminals on one side of the direct-current capacitor module 500 are connected to three bridging arms of a three-phased rectifier of the variable-frequency driver, and three terminals on the other side of the direct-current capacitor module 500 are connected to three bridging arms of a three-phased inverter of the variable-frequency driver. Therefore, the direct-current capacitor module 500 can utilized as a shared direct-current capacitor within a back-to-back three-level converter.

As shown in FIG. 5D, FIG. 5E and FIG. 5F, the three terminals on the either side of the direct-current capacitor module 500 are connected to three bridging arms of the three-phased inverter. The direct-current capacitor module 500 can be utilized in a Static Var Generator (SVG) with a three-level topology, or the direct-current capacitor module 500 can be utilized in an Active Power Filter (APF) with a three-level topology.

Either of the three-level or five-level converter includes three wiring points, which are the positive wiring terminal DC+, the neutral wiring terminal NP and the negative wiring terminal DC−. Therefore, the direct-current capacitor module 400 in FIG. 4A to FIG. 4D and the direct-current capacitor module 500 in FIG. 5A to FIG. 5F are both suitable to be applied in products of the five-level converters.

It is noticed that, if the third busbar layer L3 (i.e., the neutral bus) and one of the insulation plate (the first insulation plate LS1 or the second insulation plate LS2) are eliminated, the direct-current capacitor module 500 can be utilized within two-level products, not to be further explained here.

According to aforesaid embodiments, the first busbar layer and the second busbar layer are disposed in mirror symmetry relative to the insulation layer. Therefore, the operating currents flowing in/out through the external wiring terminal (i.e., the positive wiring terminal and the negative wiring terminal) and the sub-busbars between the DC capacitors have substantially the same current amplitude and opposite current directions, so as to eliminate the magnetic field outside the busbars and also to reduce the parasitic inductance of the laminated busbar structure. In addition, electrical connective screws and apertures for aforesaid screws, required by the traditional laminated busbar structure, are not necessary to the insulation layer in the disclosure. Furthermore, there are certain air gaps formed between the first busbar layer and the insulation layer and between the second busbar layer and the insulation layer. In other words, the first busbar layer and the second busbar layer are separated by the insulation layer (e.g., the insulation plate or other solid insulation materials) and the air gaps, so as to form a double insulation effect which can easily ensure the reliability of the electrical insulation.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A direct-current capacitor module, comprising:
a plurality of direct-current capacitors, each of the direct-current capacitors comprising two capacitor binding posts, the direct-current capacitors being grouped into a first portion and a second portion, the capacitor binding posts of the direct-current capacitors in the first portion being disposed to face the capacitor binding posts of the direct-current capacitors in the second portion respectively; and
a laminated busbar structure configured to be electrically connected with the capacitor binding posts of the direct-current capacitors, the laminated busbar structure having a positive wiring terminal and a negative wiring terminal, the laminated busbar structure comprising:
a first busbar layer comprising a first sub-busbar electrically connected between at least two direct-current capacitors in the first portion;
a second busbar layer comprising a second sub-busbar electrically connected between at least two direct-current capacitors in the second portion; and
an insulation layer disposed between the first busbar layer and the second busbar layer.

2. The direct-current capacitor module of claim 1, wherein the direct-current capacitor module is a two-level direct-current capacitor module, the first busbar layer further comprises a third sub-busbar, the second busbar layer further comprises a fourth sub-busbar, the third sub-busbar of the first busbar layer is electrically connected to the fourth sub-busbar of the second busbar layer.

3. The direct-current capacitor module of claim 2, wherein the first busbar layer further comprises a positive wiring busbar, the positive wiring busbar is electrically connected to the positive wiring terminal and at least one of the direct-current capacitors in the first portion, the second busbar layer further comprises a negative wiring busbar, the negative wiring busbar is electrically connected to the negative wiring terminal and at least one of the direct-current capacitors in the second portion.

4. The direct-current capacitor module of claim 3, wherein each of the first portion and the second portion comprises N*M direct-current capacitors arranged in N rows, each row has M direct-current capacitors, the positive wiring busbar is electrically connected to M direct-current capacitors on one row in the first portion, the negative wiring busbar is electrically connected to M direct-current capacitors on one row in the second portion, the first sub-busbar is electrically connected between 2*M direct-current capacitors on two adjacent rows in the first portion, the second sub-busbar is electrically connected between 2*M direct-current capacitors on two adjacent rows in the second portion, N and M are both positive integers.

5. The direct-current capacitor module of claim 2, wherein the first busbar layer further comprises a positive wiring busbar and a negative wiring busbar, the positive wiring busbar is electrically connected to the positive wiring terminal and at least one of the direct-current capacitors in the first portion, the negative wiring busbar is electrically connected to the negative wiring terminal and at least one of the direct-current capacitors in the first portion.

6. The direct-current capacitor module of claim 1, wherein the direct-current capacitor module is a multi-level direct-current capacitor module, the laminated busbar structure further comprises a third busbar layer, the third busbar layer is disposed within the insulation layer.

7. The direct-current capacitor module of claim 6, wherein the insulation layer comprises a first insulation plate and a second insulation plate, the first insulation plate is disposed between the third busbar layer and the first busbar layer, the second insulation plate is disposed between the third busbar layer and the second busbar layer.

8. The direct-current capacitor module of claim 6, wherein the insulation layer comprises an insulation material covered on both sides of the third busbar layer.

9. The direct-current capacitor module of claim 6, wherein the laminated busbar structure further comprises a neutral wiring terminal, the first busbar layer comprises a third sub-busbar, the second busbar layer comprises a fourth sub-busbar, the third busbar layer comprises a neutral sub-busbar electrically connected to the neutral wiring terminal, the third sub-busbar and the fourth sub-busbar.

10. The direct-current capacitor module of claim 9, wherein the first busbar layer further comprises a positive wiring busbar, the positive wiring busbar is electrically connected to the positive wiring terminal and at least one of the direct-current capacitors in the first portion, the second busbar layer further comprises a negative wiring busbar, the negative wiring busbar is electrically connected to the negative wiring terminal and at least one of the direct-current capacitors in the second portion.

11. The direct-current capacitor module of claim 10, wherein each of the first portion and the second portion comprises N*M direct-current capacitors arranged in N rows, each row has M direct-current capacitors, the positive wiring busbar is electrically connected to M direct-current capacitors on one row in the first portion, the negative wiring busbar is electrically connected to M direct-current capacitors on one row in the second portion, the first sub-busbar is electrically connected between 2*M direct-current capacitors on two adjacent rows in the first portion, the second sub-busbar is electrically connected between 2*M direct-current capacitors on two adjacent rows in the second portion, N and M are both positive integers.

12. The direct-current capacitor module of claim 1, wherein air gaps are existed between the first busbar layer and the insulation layer and between the second busbar layer and the insulation layer.

13. The direct-current capacitor module of claim 1, wherein the first busbar layer and the second busbar layer are disposed in mirror symmetry at opposite sides of the insulation layer.

14. A laminated busbar structure, suitable for a direct-current capacitor module, the direct-current capacitor module comprising a plurality of direct-current capacitors, each of the direct-current capacitors comprising two capacitor binding posts, the direct-current capacitors being grouped into a first portion and a second portion, the laminated busbar structure being configured to be electrically connected with the capacitor binding posts of the direct-current capacitors, comprising:
 a positive wiring terminal;
 a negative wiring terminal;
 a first busbar layer comprising a first sub-busbar electrically connected between at least two direct-current capacitors in the first portion;
 a second busbar layer comprising a second sub-busbar electrically connected between at least two direct-current capacitors in the second portion; and
 an insulation layer disposed between the first busbar layer and the second busbar layer.

15. The laminated busbar structure of claim 14, wherein the first busbar layer further comprises a third sub-busbar, the second busbar layer further comprises a fourth sub-busbar, the third sub-busbar of the first busbar layer is electrically connected to the fourth sub-busbar of the second busbar layer.

16. The laminated busbar structure of claim 15, wherein the first busbar layer further comprises a positive wiring busbar, the positive wiring busbar is electrically connected to the positive wiring terminal and at least one of the direct-current capacitors in the first portion, the second busbar layer further comprises a negative wiring busbar, the negative wiring busbar is electrically connected to the negative wiring terminal and at least one of the direct-current capacitors in the second portion.

17. The laminated busbar structure of claim 16, wherein each of the first portion and the second portion comprises N*M direct-current capacitors arranged in N rows, each row has M direct-current capacitors, the positive wiring busbar is electrically connected to M direct-current capacitors on one row in the first portion, the negative wiring busbar is electrically connected to M direct-current capacitors on one row in the second portion, the first sub-busbar is electrically connected between 2*M direct-current capacitors on two adjacent rows in the first portion, the second sub-busbar is electrically connected between 2*M direct-current capacitors on two adjacent rows in the second portion, N and M are both positive integers.

18. The laminated busbar structure of claim 15, wherein the first busbar layer further comprises a positive wiring busbar and a negative wiring busbar, the positive wiring busbar is electrically connected to the positive wiring terminal and at least one of the direct-current capacitors in the first portion, the negative wiring busbar is electrically connected to the negative wiring terminal and at least one of the direct-current capacitors in the first portion.

19. The laminated busbar structure of claim 14 wherein the laminated busbar structure further comprises a third busbar layer, the third busbar layer is disposed within the insulation layer.

20. The laminated busbar structure of claim 19, wherein the laminated busbar structure further comprises a neutral wiring terminal, the first busbar layer comprises a third sub-busbar, the second busbar layer comprises a fourth sub-busbar, the third busbar layer comprises a neutral sub-busbar electrically connected to the neutral wiring terminal, the third sub-busbar and the fourth sub-busbar.

21. The laminated busbar structure of claim 20, wherein the first busbar layer further comprises a positive wiring busbar, the positive wiring busbar is electrically connected to the positive wiring terminal and at least one of the direct-current capacitors in the first portion, the second busbar layer further comprises a negative wiring busbar, the negative wiring busbar is electrically connected to the negative wiring terminal and at least one of the direct-current capacitors in the second portion.

22. The laminated busbar structure of claim 21, wherein each of the first portion and the second portion comprises N*M direct-current capacitors arranged in N rows, each row has M direct-current capacitors, the positive wiring busbar is electrically connected to M direct-current capacitors on one row in the first portion, the negative wiring busbar is electrically connected to M direct-current capacitors on one row in the second portion, the first sub-busbar is electrically connected between 2*M direct-current capacitors on two adjacent rows in the first portion, the second sub-busbar is electrically connected between 2*M direct-current capacitors on two adjacent rows in the second portion, N and M are both positive integers.

* * * * *